(12) United States Patent
Choi et al.

(10) Patent No.: US 7,299,547 B2
(45) Date of Patent: Nov. 27, 2007

(54) METHOD FOR MANUFACTURING TAPE WIRING BOARD

(75) Inventors: Kyoung-Sei Choi, Gyeonggi-do (KR); Sa-Yoon Kang, Seoul (KR); Yong-Hwan Kwon, Gyeonggi-do (KR); Chung-Sun Lee, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 44 days.

(21) Appl. No.: 11/086,614

(22) Filed: Mar. 21, 2005

(65) Prior Publication Data

US 2006/0003568 A1    Jan. 5, 2006

(30) Foreign Application Priority Data

Jun. 30, 2004    (KR) .................. 10-2004-0050204

(51) Int. Cl.
*H05K 3/02*    (2006.01)
*H05K 3/10*    (2006.01)

(52) U.S. Cl. .................. 29/846; 29/829; 29/830; 29/831; 29/849; 174/261; 264/104; 438/652

(58) Field of Classification Search ............ 29/825, 29/830, 842, 844, 846, 852, 853, 829; 174/257, 174/261; 216/44, 52, 87, 94, 84; 264/104, 264/253, 259, 496; 427/405; 361/748, 749; 438/610, 652
See application file for complete search history.

(56) References Cited

U.S. PATENT DOCUMENTS

| | | | | |
|---|---|---|---|---|
| 2,963,748 A | * | 12/1960 | Young | 264/104 |
| 3,340,606 A | * | 9/1967 | Anderson et al. | 29/849 |
| 4,302,501 A | * | 11/1981 | Nagashima | 428/209 |
| 4,327,124 A | * | 4/1982 | DesMarais, Jr. | 29/846 |
| 4,614,837 A | * | 9/1986 | Kane et al. | 29/851 |
| 5,259,926 A | * | 11/1993 | Kuwabara et al. | 216/54 |

(Continued)

FOREIGN PATENT DOCUMENTS

JP    2003-331662    11/2003

(Continued)

OTHER PUBLICATIONS

English language abstract of Korean Publication No. 2002-0095505.

(Continued)

*Primary Examiner*—Minh Trinh
*Assistant Examiner*—Donghai D. Nguyen
(74) *Attorney, Agent, or Firm*—Marger Johnson & McCollom, P.C.

(57) ABSTRACT

A method for manufacturing a tape wiring board in accordance with the present invention may employ an imprinting process in forming a wiring pattern, thereby reducing the number of processes for manufacturing a tape wiring board and allowing the manufacturing process to proceed in a single production line. Therefore, the manufacturing time and cost may be reduced. A profile of the wiring pattern may be determined by the shape of an impression pattern of a mold. This may establish the top width of inner and outer leads and incorporate fine pad pitch. Although ILB and OLB process may use an NCP, connection reliability may be established due to the soft and elastic wiring pattern.

15 Claims, 13 Drawing Sheets

U.S. PATENT DOCUMENTS 5,772,905 A * 6/1998 Chou .................... 216/44
6,547,995 B1 * 4/2003 Comb .................... 264/40.1

FOREIGN PATENT DOCUMENTS

| KR | 2002-0095505 | 12/2002 |
| KR | 2003-0019977 | 3/2003 |

OTHER PUBLICATIONS

English language abstract of Korean Publication No. 2003-0019977.

English language abstract of Japanese Publication No. 2003-331662.

* cited by examiner

METHOD FOR MANUFACTURING TAPE WIRING BOARD

CROSS REFERENCE TO RELATED APPLICATIONS

This U.S. non-provisional application claims priority under 35 U.S.C. § 119 of Korean Patent Application No. 2004-50204, filed on Jun. 30, 2004, the entire contents of which are incorporated herein by reference.

BACKGROUND OF THE INVENTION

1. Field of the Invention

The present invention relates to a method for manufacturing a tape wiring board for a semiconductor package and, more particularly, to a method for manufacturing a tape wiring board, by imprinting a conductive polymer and forming a wiring pattern.

2. Description of the Related Art

Tape automated bonding (TAB) techniques may employ inner lead bonding (ILB) for inner connections. TAB techniques also may provide a reel-to-reel package assembly using a reel type tape wiring board. A package manufactured by the TAB technique is referred to as a TAB package. The TAB package may include a tape carrier package (TCP) and a chip on flex (COF). The TAB package may be thin and have fine pitch. A TAB package may be used in a wide range of applications, examples include in a watch, a calculator, a driver for a liquid crystal display and a micro-processor for a personal computer.

The tape wiring board also may be used for a semiconductor package such as a micro-BGA (µBGA) package and a chip on board (COB) package.

FIG. 1 is a cross-sectional view of a conventional tape wiring board 10. Referring to FIG. 1, a tape wiring board 10 may include a base film 11 and a wiring pattern 12 formed on the base film 11. A solder resist layer 19 may protect the wiring pattern 12, and may only partially cover it, exposing some of the wiring pattern 12 to connect with a semiconductor chip or an external terminal. The base film 11 may include a thermosetting polyimide tape. The wiring pattern 12 may include a wiring layer of Cu. The wiring pattern 12 may include an under barrier metallurgy (UBM) layer 13 formed on the base film 11, a wiring line 14 of Cu formed on the UBM layer 13, and a plating layer 15 of Sn surrounding the wiring line 14.

FIG. 2 is a flow chart of a conventional method 20 for manufacturing a tape wiring board 10.

Referring to FIG. 2, a base film 11 may be provided (21) and may include a thermosetting polyimide tape. The base film 11 may be formed from a polyamic acid solution by drum casting, drying and curing processes. An annealing process may improve the dimensional stability of the base film 11.

A UBM layer 13 may be formed (22), for example, on one surface of the base film 11. The UBM layer 13 may be made of materials that can adhere to the base film 11 and have metallic bondability with a Cu layer. For example, the UBM layer 13 may be formed using (Cr+Cu)/Ni by a sputtering method.

A Cu layer may be formed (23) on the UBM layer 13 at a predetermined thickness using the UBM layer 13 as a plating electrode.

The Cu layer may be patterned to form a Cu wiring line 14 (24) for example by a photolithographic process. Specifically, an anticorrosive layer and an oxidation layer formed on the Cu layer may be removed by a soft etching process. The Cu layer may be etched to a thickness suitable for forming the Cu wiring line 14.

A photosensitive film may be applied to the Cu wiring layer. A portion of the photosensitive film may be removed through exposure and development processes. A portion of the Cu layer may be removed by an etching process, leaving a portion of the Cu layer to be a wiring line. The remaining Cu layer may be removed as well as the remaining photosensitive film.

A Sn plating layer 15 may be formed (25) and may surround the Cu wiring line 14. A Sn plating layer 15 may prevent oxidization of the Cu wiring line 14 and improve the bondability of the Cu wiring line 14 with an external terminal. Thus, formation of a wiring pattern 12 may be completed.

A solder resist layer 19 may be formed (26), for example by printing a solder resist. A solder resist layer 19 may protect the wiring pattern 12. The solder resist layer 19 may exclude a portion of the wiring pattern 12 to connect with inner and outer terminals.

The conventional method for manufacturing a tape wiring board may comprise providing a base film, forming a Cu layer, and patterning a Cu layer. These processes may even be performed in separate production lines.

Formation of a wiring pattern with Cu and a photolithographic may be quite complicated. The photolithographic may include a number of individual processes, which in turn may increase manufacturing time and cost.

SUMMARY OF THE INVENTION

An embodiment of the present invention is directed to a method for manufacturing a tape wiring board which may reduce the number of manufacturing processes.

An embodiment of the present invention is directed to a method for manufacturing a tape wiring board which may proceed in a single production line.

An embodiment of the present invention is directed to a method for manufacturing a tape wiring board which may reduce the manufacturing cost.

In one embodiment, a method for manufacturing a tape wiring board includes forming a conductive polymer layer on a base film; imprinting the conductive polymer layer by a mold to form a wiring pattern; and forming a solder resist layer to cover the wiring pattern.

BRIEF DESCRIPTION OF THE DRAWINGS

Exemplary embodiments of the present invention will be readily understood with reference to the following detailed description in conjunction with the accompanying drawings, wherein like reference numerals designate like structural elements, and in which:

FIGS. 4 through 8 are views of aspects of the method of FIG. 3;

FIG. 4 is a cross-sectional view of a base film;

FIG. 5 is a cross-sectional view of forming a conductive polymer layer on a base film;

FIG. 7 is a cross-sectional view of removing residue;

FIG. 8 is a cross-sectional view of forming a solder resist layer;

FIGS. 10 through 13 are views of aspects of the method of FIG. 9;

FIG. 10 is a cross-sectional view of providing a base film having a polyimide film and thermoplastic polymer layers;

FIG. 13 is a cross-sectional view of forming a solder resist layer;

FIG. 15 is a cross-sectional view of forming a concave wiring pattern;

FIG. 16 is a cross-sectional view of forming a mask layer;

FIG. 17 is a cross-sectional view of forming a conductive polymer layer on a wiring pattern area;

FIG. 18 is a cross-sectional view of removing a mask layer; and

FIG. 19 is a cross-sectional view of forming a solder resist layer.

These drawings are provided for illustrative purposes only and are not drawn to scale. The spatial relationships and relative sizing of the elements illustrated in the various embodiments may have been reduced, expanded or rearranged to improve the clarity of the figure with respect to the corresponding description. The figures, therefore, should not be interpreted as accurately reflecting the relative sizing or positioning of the corresponding structural elements that could be encompassed by an actual device manufactured according to the exemplary embodiments of the invention.

DETAILED DESCRIPTION OF SOME EXEMPLARY EMBODIMENTS

Embodiments of the present invention are described more fully with reference to the accompanying drawings. This invention may be embodied in many different forms and should not be construed as limited to the particular embodiments set forth herein. Rather, these embodiments are provided for purposes of illustration.

In the description, well-known structures and processes have not been described or illustrated in detail in order to avoid obscuring the present invention. It will be appreciated that for simplicity and clarity of illustration, some elements illustrated in the figures have not necessarily been drawn to scale. For example, the dimensions of some of the elements have been exaggerated or reduced relative to other elements for clarity.

First Embodiment

Figure 1:
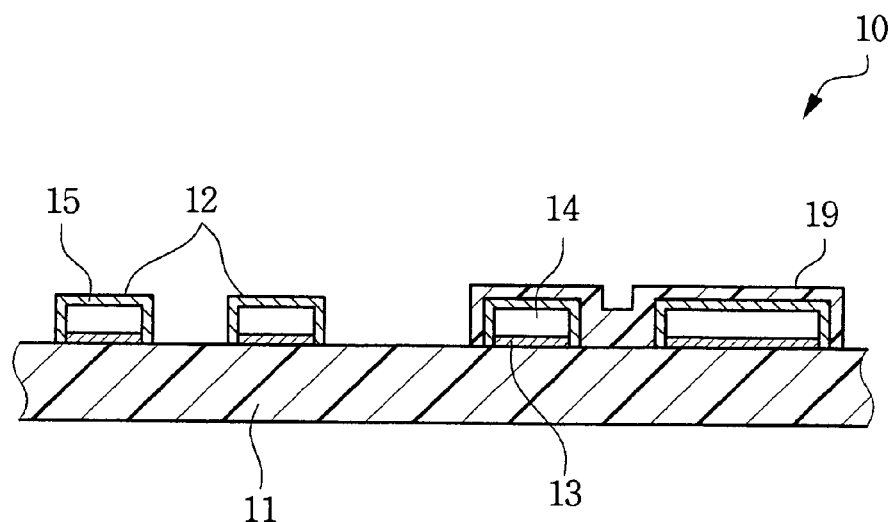
FIG. 1 is a cross-sectional view of a conventional tape wiring board.
Figure 2:
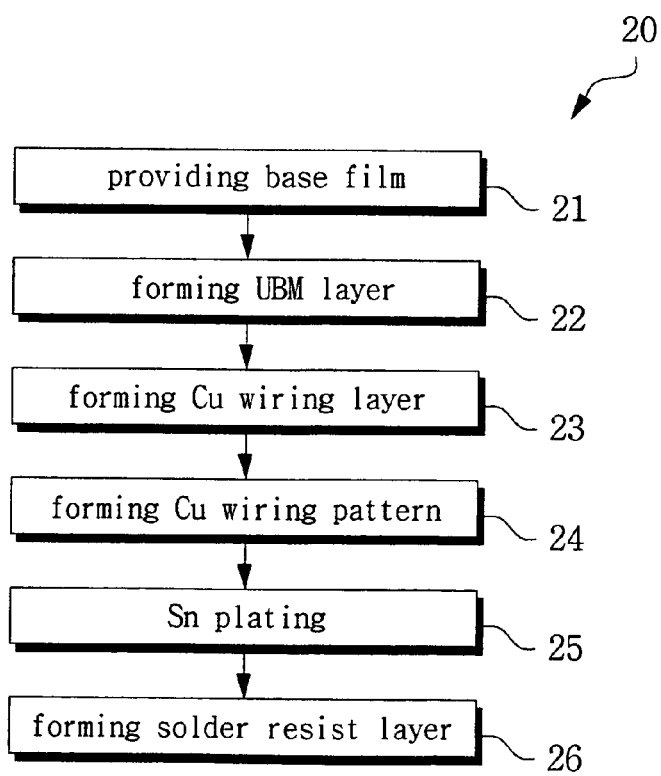
FIG. 2 is a flow chart of a conventional method for manufacturing a tape wiring board.
Figure 3:
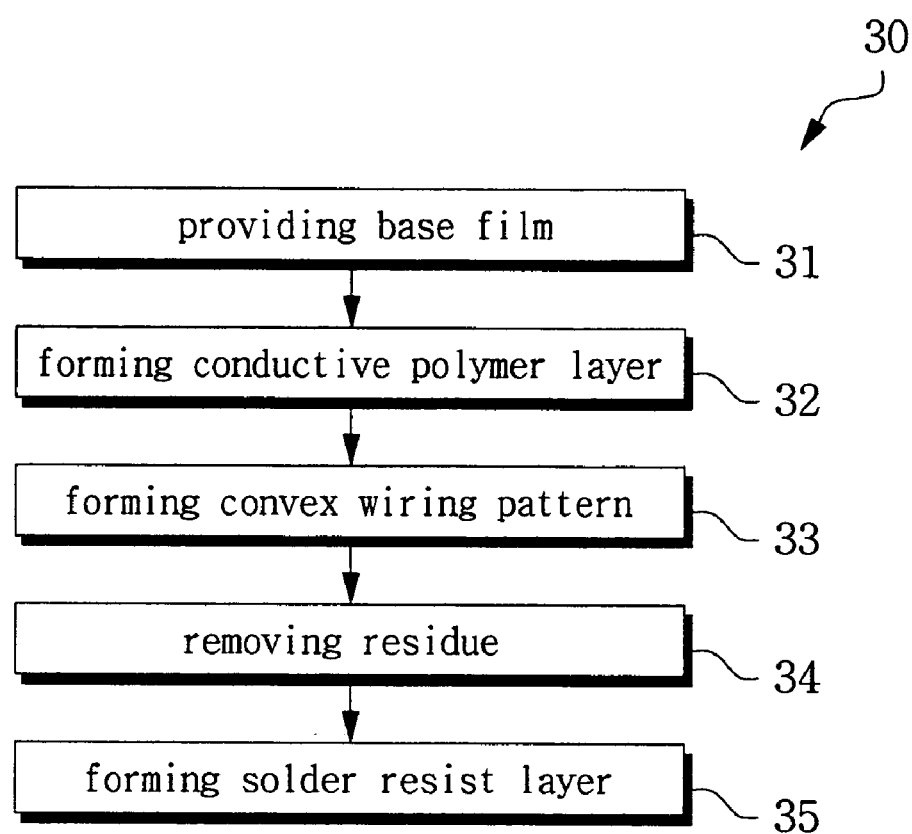
FIG. 3 is a flow chart of a method for manufacturing a tape wiring board using a conductive polymer in accordance with an embodiment of the present invention.

FIG. 3 is a flow chart of a method 30 for manufacturing a tape wiring board using a conductive polymer in accordance with an embodiment of the present invention. FIGS. 4 through 8 are views of aspects of the method 30 of FIG. 3.

Figure 4:
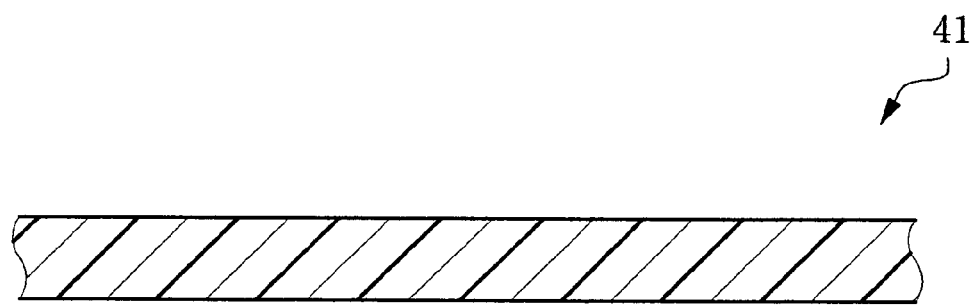

Referring to FIG. 4, the method 30 may start with providing a base film 41 (31 of FIG. 3). The base film 41 may include a thermosetting polyimide tape. The base film 41 may be formed from a polyamic acid solution by drum casting, drying and curing processes. An annealing process may be performed to improve the dimensional stability of the base film 41.

Figure 5:
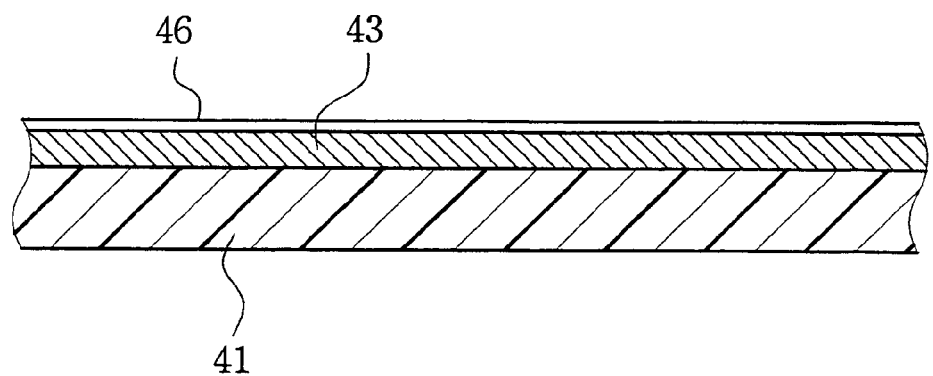

Referring to FIG. 5, a conductive polymer layer 43 may be formed (32 of FIG. 3). A conductive polymer may coat a surface of the base film 41 at a predetermined thickness to form the conductive polymer layer 43. The thickness of the conductive polymer layer 43 may even be greater than the depth of an impression pattern of a mold.

An example conductive polymer may include a mixture of a thermoplastic polymer and conductive nano-particles. An example thermoplastic polymer may be a liquid polymer, with a viscosity which may reduce significantly at the melting point or higher and which may melt between about 250° C. and about 320° C. The conductive nano-particles may include nanosilver, carbon nanotube (CNT), carbon nanofiber (CNF) or combinations thereof. An example size of the conductive nano-particles may be about 0.2 µm or even less.

A protection layer 46 may be formed on the conductive polymer layer 43. The protection layer 46 may prevent the conductive polymer layer 43 from adhering to a mold during an imprinting process. Silane or silicone polymer solution may be sprayed on the conductive polymer layer 43 and be dried to form the protection layer 46.

Figure 6A:
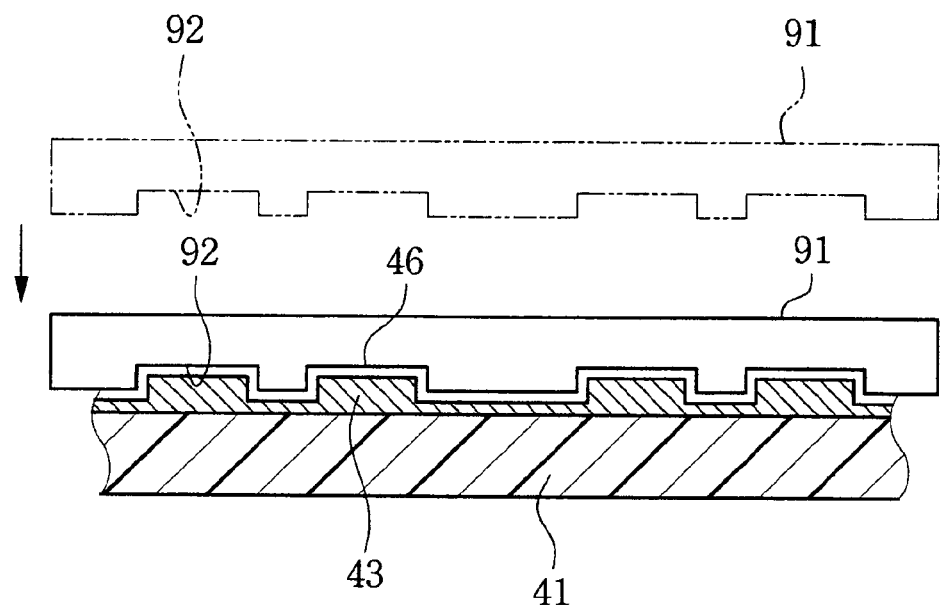
FIG. 6A is a cross-sectional view of imprinting a conductive polymer layer using a mold.
Figure 6B:
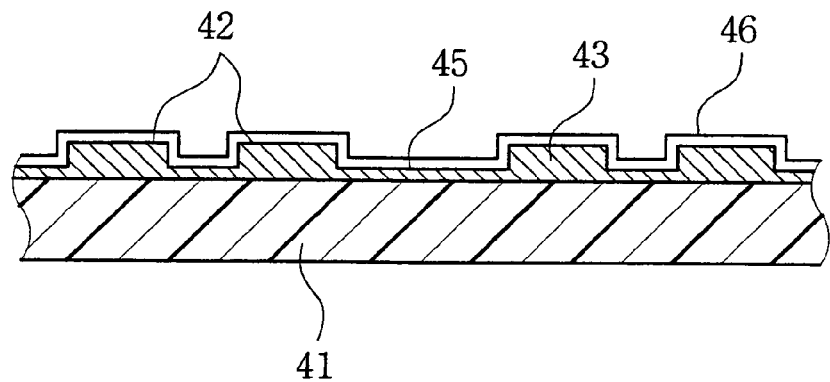
FIG. 6B is a cross-sectional view of forming a wiring pattern.

Referring to FIGS. 6A and 6B, a wiring pattern 42 may be formed (33 of FIG. 3). A mold 91 may have an impression pattern 92 at the bottom surface thereof. The impression pattern 92 may be engraved corresponding to the wiring pattern. After imprinting, the conductive polymer layer 43 may be formed on surface features such as on a concave portion 45 or a convex portion. This embodiment may use the convex portion as the wiring pattern 42.

Specifically, the conductive polymer layer 43 may be heated by any heating means, such as an infrared lamp. An example heating temperature may be higher than the melting point of the conductive polymer and lower than the glass transition temperature (Tg) of the base film 41. A typical Tg of the base film 41 may be approximately 350° C.

The conductive polymer layer 43 may be impressed by the mold 91. The impression pattern 92 of the mold 91 may be imprinted on the conductive polymer layer 43. The wiring pattern 42 may be formed on the conductive polymer layer 43. During an imprinting process, the mold 91 may be cooled continuously. In order to remove residue easily, the mold 91 may impress the conductive polymer layer 43 close to one surface of the base film 41.

The mold 91 may have at least one impression pattern 92 for manufacturing at least one semiconductor package. The mold 91 may provide wiring patterns 42 simultaneously, for example to a plurality of semiconductor packages, thereby improving productivity. The impression patterns 92 may be arranged in a matrix, for example layouts of 2×5 and 4×3 patterns.

Figure 7:
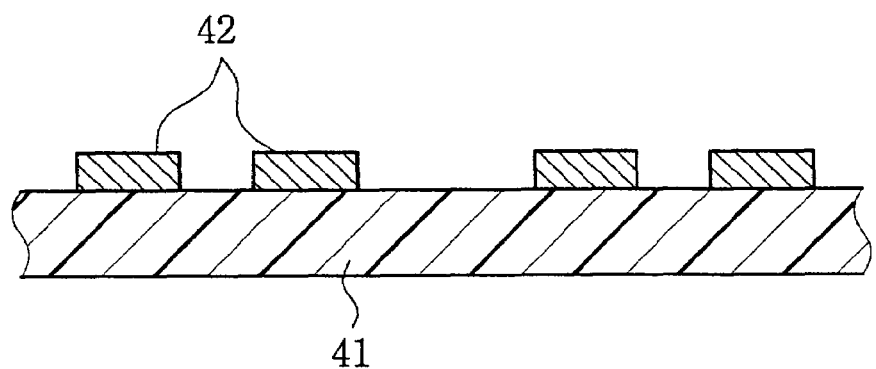

Referring to FIG. 7, residue may be removed (34 of FIG. 3). The conductive polymer layer 43 of a concave portion (45 of FIG. 6B) may be removed, for example by a dry etching method. If the wiring pattern 42 has the protection layer (46 of FIG. 6B) formed thereon, the protection layer may be removed, for example by a plasma cleaning process.

Figure 8:
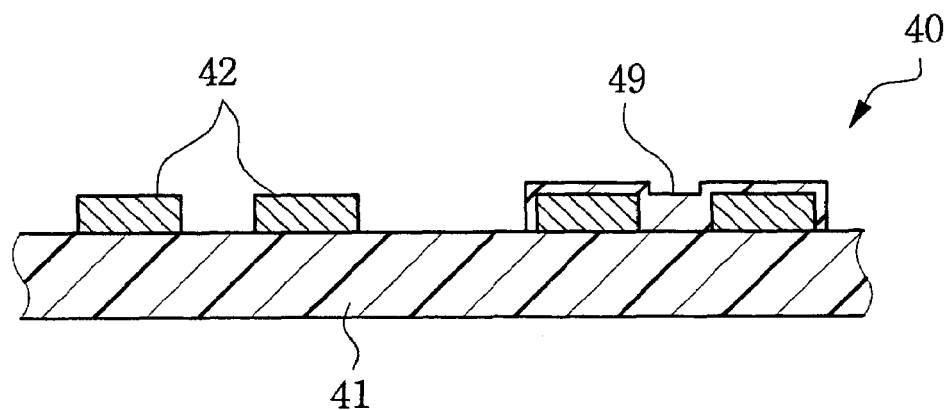

Referring to FIG. 8, a solder resist layer 49 may be formed (35 of FIG. 3). A solder resist may be printed on the wiring pattern 42 to form the solder resist layer 49. The solder resist layer 49 may exclude a portion of the wiring pattern 42 to be connected with an external terminal. Thus, a tape wiring board 40 may be completed.

A profile of the wiring pattern 42 of this embodiment may be determined by the shape of the mold 91. This may establish the top width of inner and outer leads and incorporate fine pad pitch.

When a tape carrier package is manufactured by a TAB process using an embodiment tape wiring board 40, a semiconductor chip may be mounted on the tape wiring board 40 by an inner lead bonding (ILB) process, and the TAB package may be connected with an external device by an outer lead bonding (OLB) process.

The ILB process may include a low temperature bonding process, for example a non-conductive paste (NCP) process in consideration of the heat resistance of the wiring pattern 42 of conductive polymer. The curing temperature of NCP may not exceed the melting point of conductive polymer, for example, the curing temperature may be maintained at approximately 240° C., or less. Although the ILB process uses the NCP, connection reliability may be established due to the soft and elastic wiring pattern 42.

The OLB process may include a non-conductive film (NCF) bonding process. Although the OLB process uses the NCF, connection reliability may be established due to the soft and elastic wiring pattern 42. The OLB process may include a conventional anisotropic conductive film (ACF) bonding process.

Second Embodiment

Although the first embodiment shows a wiring pattern may be formed by imprinting a conductive polymer layer formed on a base film, the wiring pattern may be formed by imprinting a thermoplastic polymer layer formed on a base film and forming a conductive polymer layer on a wiring pattern area. The wiring pattern area may be formed on surface features such as concave or convex portions. A second embodiment shows a convex wiring pattern area and a third embodiment shows a concave wiring pattern area.

Figure 9:
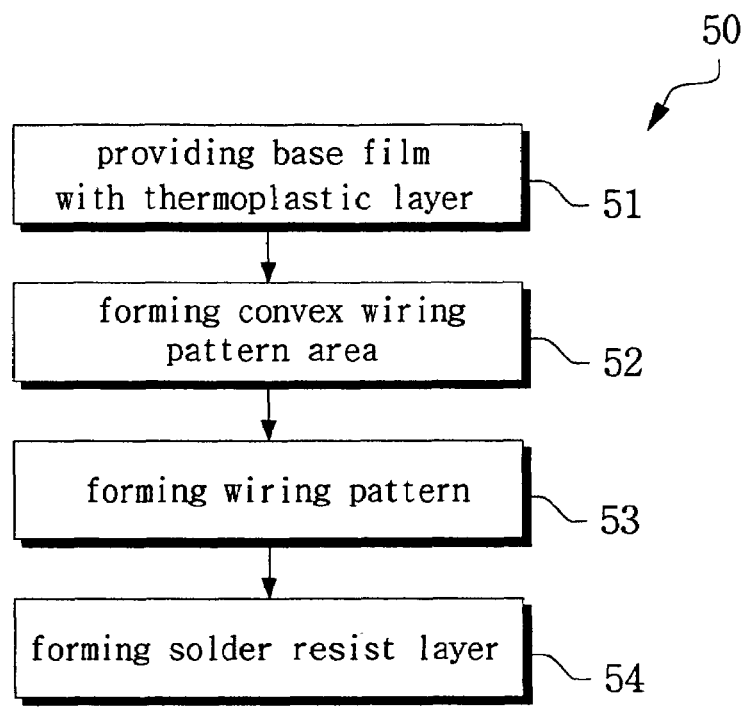
FIG. 9 is a flow chart of a method for manufacturing a tape wiring board using a conductive polymer in accordance with an embodiment of the present invention.

FIG. 9 is a flow chart of a method 50 for manufacturing a tape wiring board using a conductive polymer in accordance with a second embodiment of the present invention. FIGS. 10 through 13 are views of each aspect of the method 50 of FIG. 9.

Figure 10:
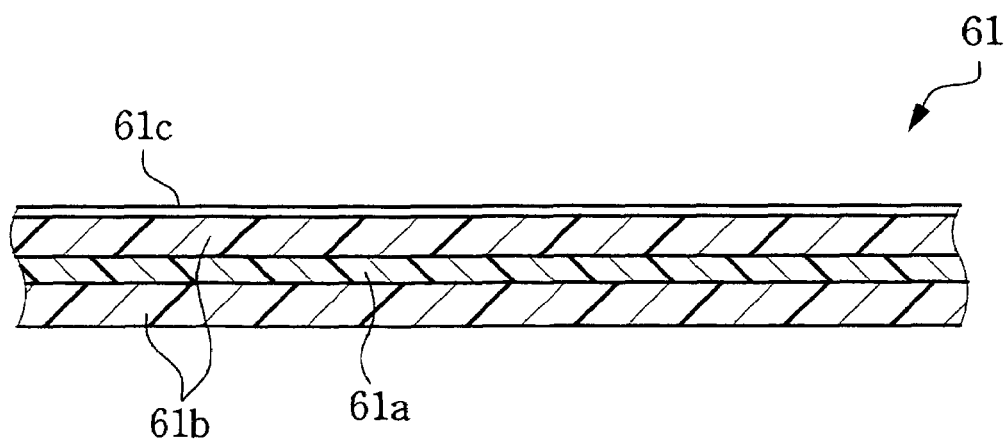

Referring to FIG. 10, the method 50 of the second embodiment may start with providing a base film 61 (51 of FIG. 9). An example base film 61 may have a thermosetting polyimide tape 61a and thermoplastic polymer layers 61b formed on both sides of the thermosetting polyimide tape 61a. The polyimide tape 61a may be formed from a polyamic acid solution by drum casting, drying and curing processes. An example thermoplastic polymer layer 61b may comprise thermoplastic polyimide and be formed by casting, drying and curing processes. Thus a three-layered base film 61 may be completed. Alternatively, a three-layered base film 61 may be created by co-extruding, drying and curing the thermosetting polyimide tape 61a and the thermoplastic polymer 61b. An annealing process may be performed to improve the dimensional stability of the base film 61. The polyimide tape 61a and thermoplastic polymer layer 61b may be non-conductive.

A first protection layer 61c may be formed, for example, by spraying and drying silane or silicone polymer solution on the thermoplastic polymer layer 61b. A first protection layer 61c may prevent the thermoplastic polymer layer 61b from adhering to a mold 93 during an imprinting process.

Figure 11A:
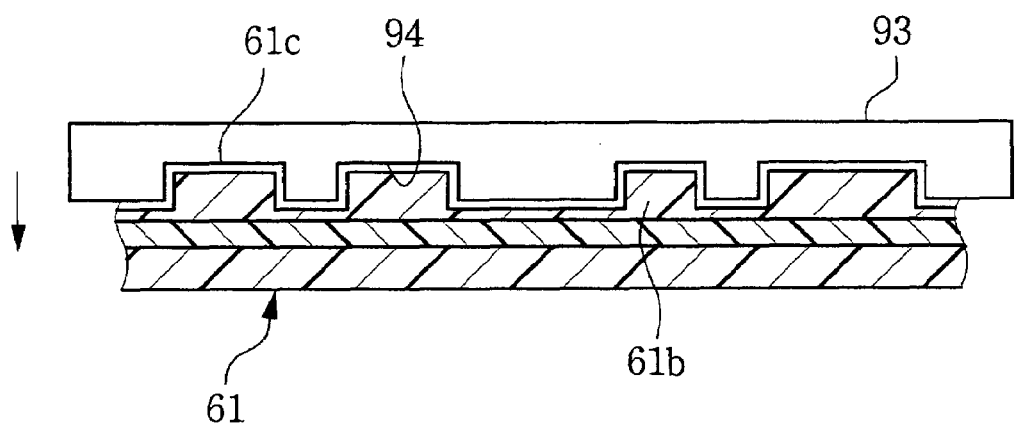
FIG. 11A is a cross-sectional view of imprinting a thermoplastic polymer layer using a mold.
Figure 11B:
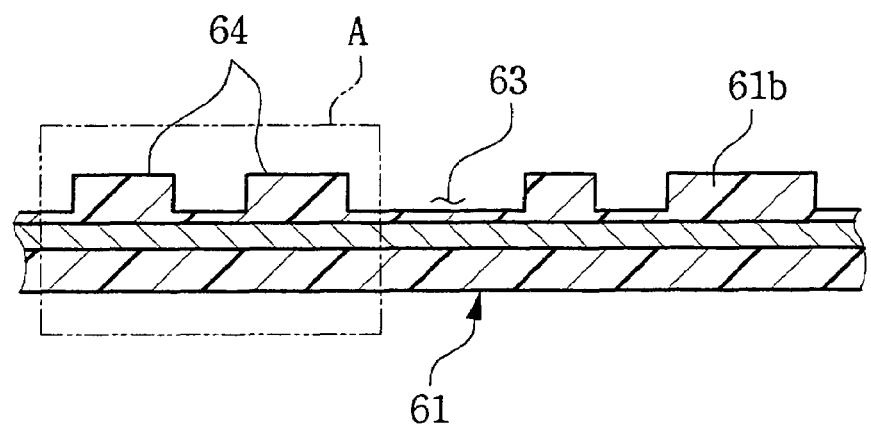
FIG. 11B is a cross-sectional view of forming a convex wiring pattern.

Referring to FIGS. 11A and 11B, a convex wiring pattern area 64 may be formed (52 of FIG. 9), for example by impressing the thermoplastic polymer layer 61b with a mold 93. The wiring pattern area 64 may be formed on the thermoplastic polymer layer 61b. This imprinting method may provide a surface feature, for example concave or convex portions, on the thermoplastic polymer layer 61b. The second embodiment may use the convex portion as the wiring pattern area 64. The mold 93 may have an impression pattern 94 at the bottom surface thereof. The impression pattern 94 may correspond to the wiring pattern.

A plasma cleaning process may be used to remove the first protection layer (61c of FIG. 11A) and impurities from the thermoplastic polymer layer 61b.

Figure 12A:
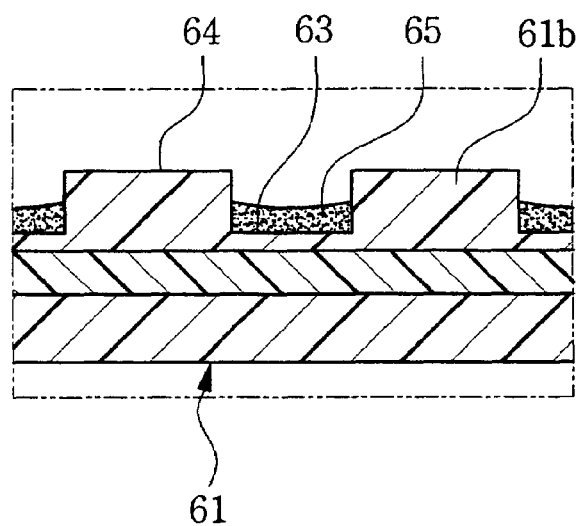
FIG. 12A is a cross-sectional view of forming a protection layer on a concave portion.
Figure 12B:
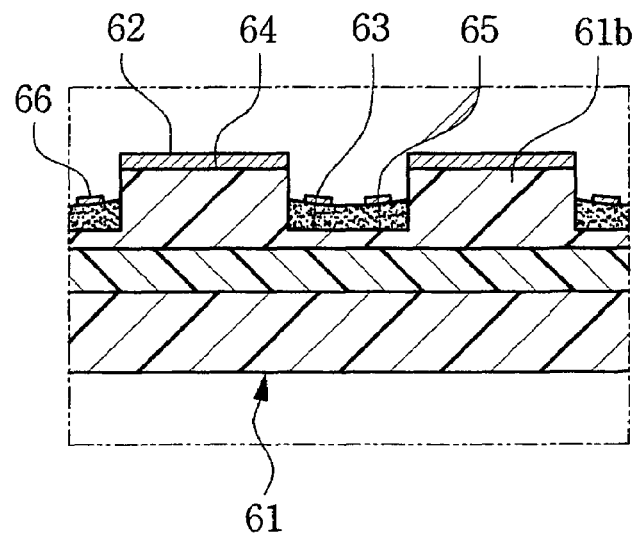
FIG. 12B is a cross-sectional view of forming a conductive polymer layer on a wiring pattern area.
Figure 12C:
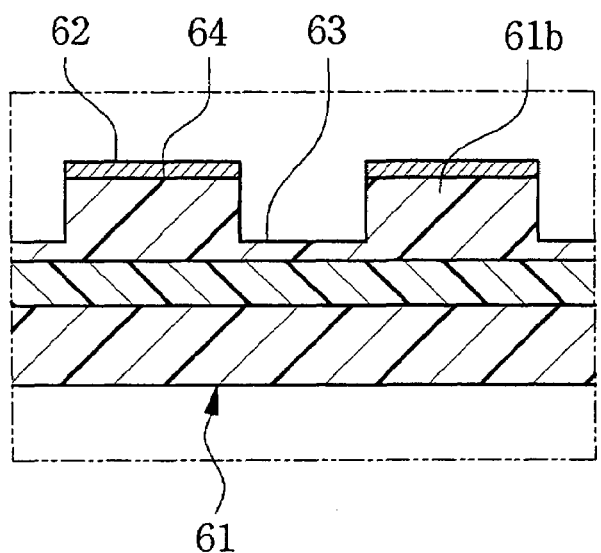
FIG. 12C is a cross-sectional view of removing residue on a concave portion.

Referring to FIGS. 12A through 12C, a wiring pattern 62 may be formed (53 of FIG. 9).

As shown in FIG. 12A, a second protection layer 65 may be formed, for example by spraying a silane or silicone polymer solution on the thermoplastic polymer layer 61b and be dried. The second protection layer 65 may be formed in the concave portion at a predetermined height, for example, by using a specific quantity of silane or silicone polymer solution. The second protection layer 65 on the wiring pattern area 64 may be removed by peeling or etching process so that a conductive polymer layer can be formed on the wiring pattern area 64.

Referring to FIG. 12B, a conductive polymer layer may be formed on the wiring pattern area 64 using a conductive polymer, thus forming a wiring pattern 62. Example methods to form the wiring pattern 62 include transfer, dipping or coating methods. The wiring patterns 62 may be between 3 μm and 4 μm.

In some instances, a portion of the conductive polymer 66 may remain on the concave portion 63. A remaining portion of the conductive polymer 66 can cause electrical short due to connection with the conductive polymer layer of an adjacent wiring pattern area 64. Therefore, the conductive polymer 66 of the concave portions 63 may be removed. For effective removal of the conductive polymer 66 of the concave portion 63, the second protection layer 65 of the concave portion 63 may be removed together with the conductive polymer 66 by a plasma cleaning process.

Example conductive polymers may include a conductive polymer solution or a paste having conductive nano-particles.

Referring to FIG. 12C, the wiring pattern 64 may be completed. The conductive polymer layer may be formed on the wiring pattern area 64.

Figure 13:
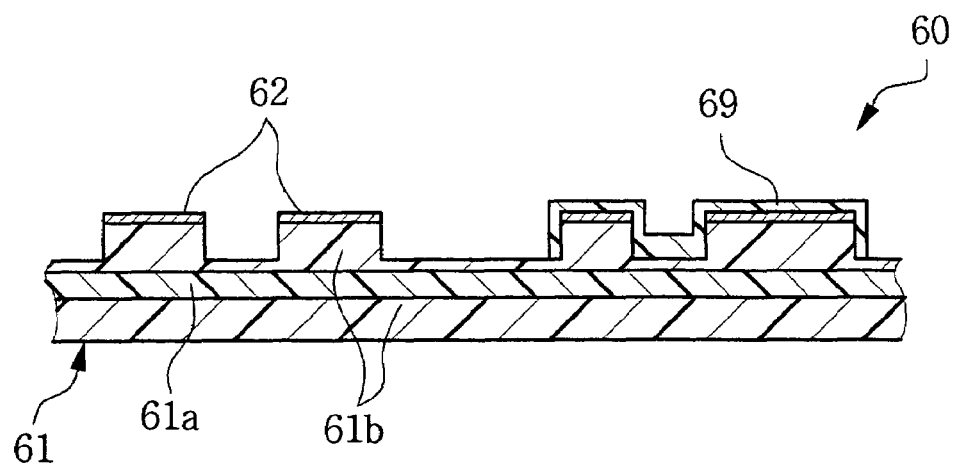

Referring to FIG. 13, a solder resist layer 69 may be formed (54 of FIG. 9). The solder resist layer 69 may cover the wiring pattern 62 and may exclude a portion of the wiring pattern 62 to be connected with inner and outer terminals. Thus, a tape wiring board 60 may be completed.

Third Embodiment

Figure 14:
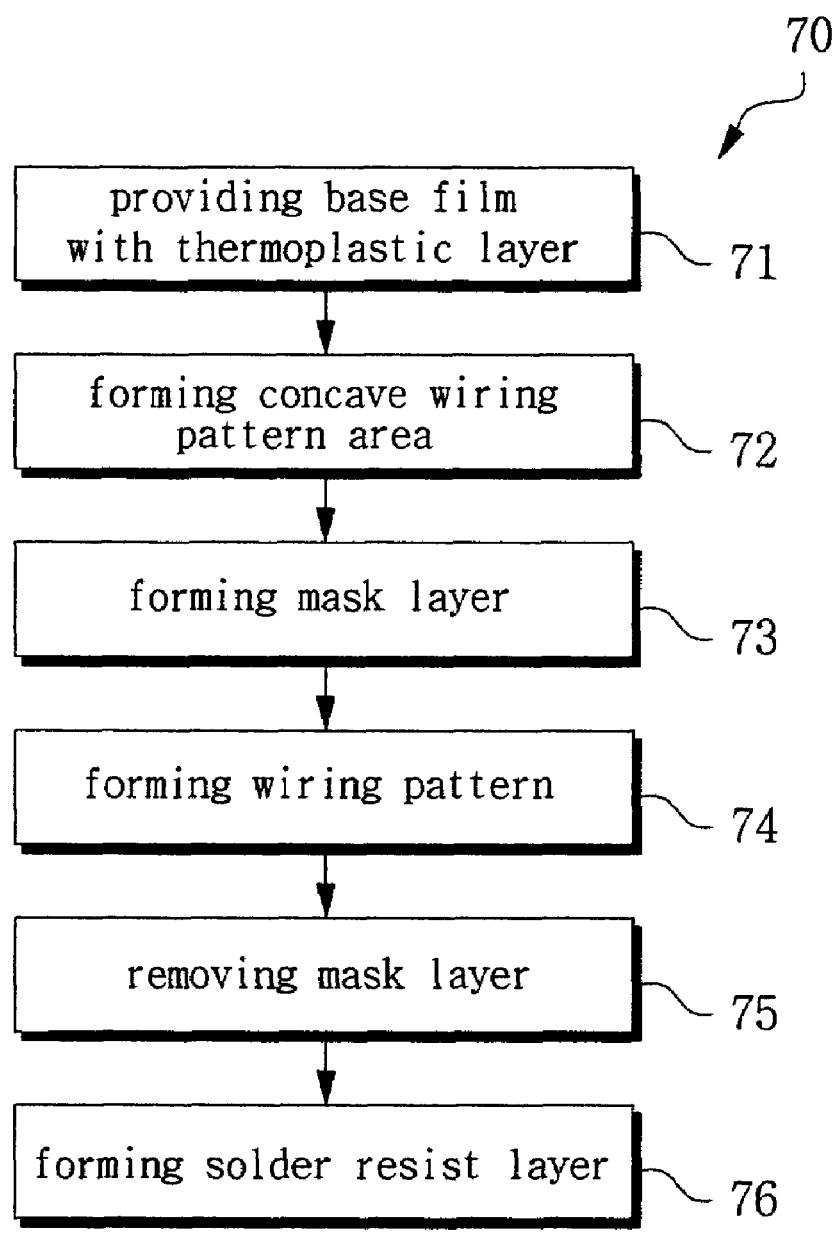
FIG. 14 is a flow chart of a method for manufacturing a tape wiring board using a conductive polymer in accordance with an embodiment of the present invention.

FIG. 14 is a flow chart of a method 70 for manufacturing a tape wiring board using a conductive polymer in accordance with a third embodiment of the present invention. FIGS. 15 through 19 are views of each aspect of the method 70 of FIG. 14.

The third embodiment may have a similar process to the second embodiment. For example, an embodiment may include providing a base film 81 having a polyimide tape 81a with thermoplastic polymer layers 81b formed on both sides of the polyimide tape 81a (71 of FIG. 14) and imprinting the thermoplastic polymer layer 81b (72 of FIG. 14). However, some embodiments may use a mold having an impression pattern of a different structure from that of the second embodiment.

Figure 15:
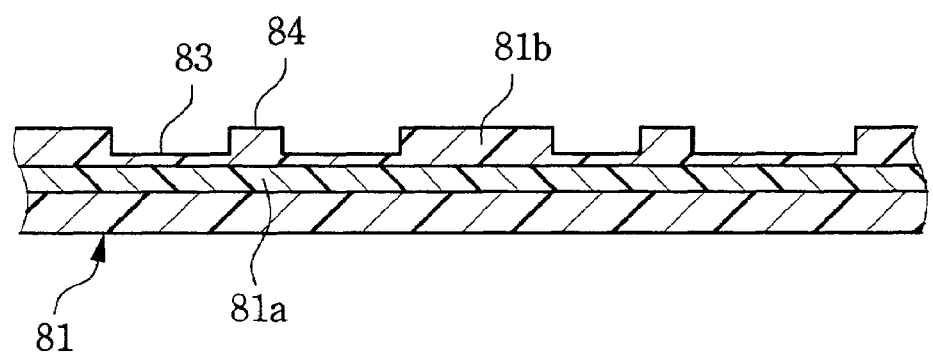
FIGS. 15 through 19 are views of aspects of the method of FIG. 14.

Referring to FIG. 15, a concave wiring pattern area 83 may be formed (72 of FIG. 14). The thermoplastic polymer layer 81b may be impressed by a mold (not shown). The wiring pattern area 83 may be formed on the thermoplastic polymer layer 81b. This imprinting method may provide a surface feature, for example on concave or convex portions 84, on the thermoplastic polymer layer 81b. This embodiment may use the concave portion as the wiring pattern area 83. The mold may have an impression pattern. The impression pattern may correspond to the wiring pattern.

A plasma cleaning process may remove a protection layer (not shown) and impurities from the thermoplastic polymer layer 81b.

Figure 16:
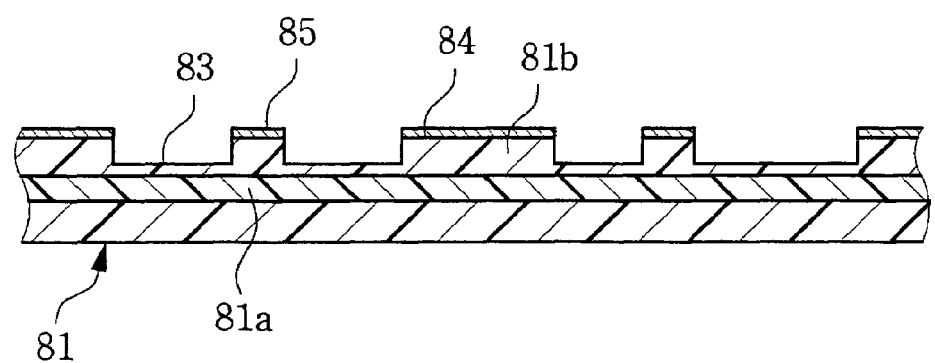

Referring to FIG. 16, a mask layer 85 may be formed (73 of FIG. 14). Silane or silicone polymer solution may be coated on the convex portion 84 to form the mask layer 85. The mask layer 85 may help fill a conductive polymer into the concave portion. The mask layer 85 may be formed by a roll coating method.

Figure 17:
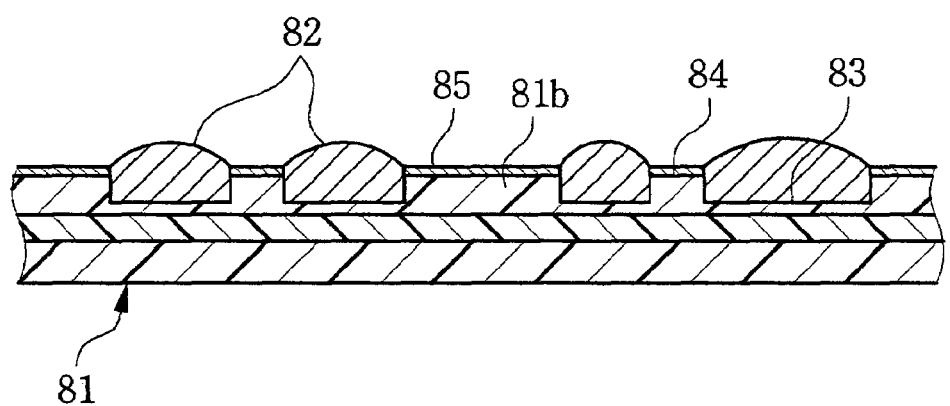

Referring to FIG. 17, a wiring pattern 82 may be formed (74 of FIG. 14). A conductive polymer may be filled into the wiring pattern area 83 and be cured to form the wiring pattern 82. An example conductive polymer includes a conductive paste containing conductive nano-particles and a mixture of a liquid thermosetting resin, such as epoxy and conductive nano-particles. An example height of the wiring pattern 82 from the upper surface of the thermoplastic polymer layer 81b may be approximately 5 μm.

Figure 18:
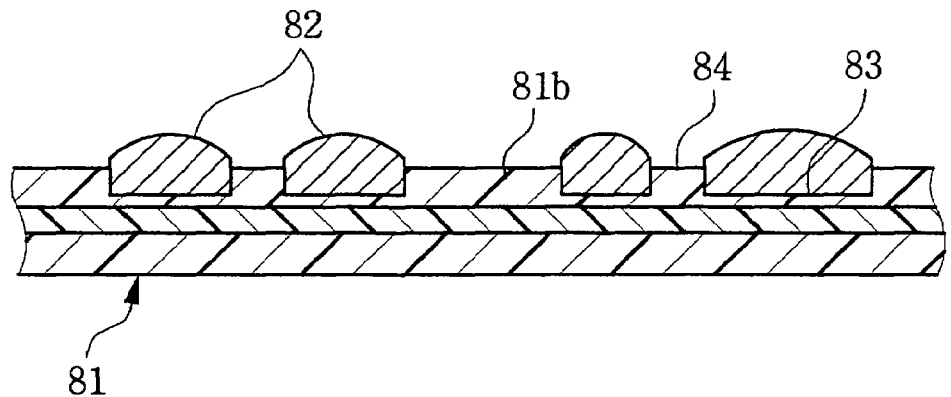

Referring to FIG. 18, the mask layer (85 of FIG. 17) may be removed (75 of FIG. 14), for example by a dry or wet etching process. A conductive polymer that may remain on the mask layer may also be removed.

Figure 19:
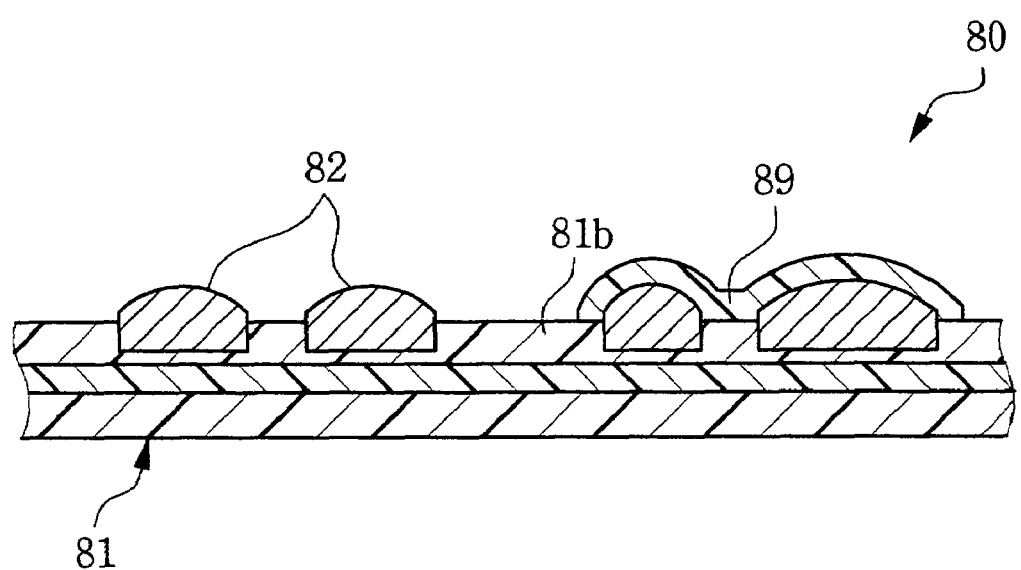

Referring to FIG. 19, a solder resist layer 89 may be formed (76 of FIG. 14). The solder resist layer 89 may cover the wiring pattern 82. The solder resist layer 89 may exclude a portion of the wiring pattern 82 to connect with inner and outer terminals. Thus, a tape wiring board 80 may be completed.

Accordingly, a method for manufacturing a tape wiring board in accordance with the present invention may employ an imprinting process in forming a wiring pattern, thereby reducing the number of processes for manufacturing a tape wiring board and allowing the manufacturing process to proceed in a single production line. Therefore, the manufacturing time and cost may be reduced.

A profile of the wiring pattern may be determined by the shape of an impression pattern of a mold. This may establish the top width of inner and outer leads and incorporate a fine pad pitch.

Although ILB and OLB processes may use an NCP, connection reliability may be established due to the soft and elastic wiring pattern.

Although some embodiments of the present invention have been described in detail hereinabove, it should be understood that many variations and/or modifications of the basic inventive concepts herein taught, which may appear to those skilled in the art, will still fall within the spirit and scope of embodiments of the present invention as defined in the appended claims.

What is claimed is:

1. A method for manufacturing a tape wiring board, the method comprising:
   forming a conductive polymer layer on a base film;
   forming a protection layer on the conductive polymer layer;
   after forming the protection layer, imprinting the conductive polymer layer by a mold to form a wiring pattern; and
   forming a solder resist layer to cover the wiring pattern.

2. The method of claim 1, further comprising removing residue before covering the wiring pattern.

3. The method of claim 2, wherein removing residue includes removing a concave portion of the conductive polymer layer by a dry etching method.

4. The method of claim 1, further comprising exposing a portion of the wiring pattern to be connected with inner and outer terminals.

5. The method of claim 1, wherein the base film includes a thermosetting polyimide tape.

6. The method of claim 1, wherein the conductive polymer layer includes a mixture of a thermoplastic polymer and conductive particles.

7. The method of claim 6, wherein the conductive particle is selected from the group consisting of a nanosilver, a carbon nanotube, a carbon nanofiber and combinations thereof.

8. The method of claim 1, wherein forming the conductive polymer layer includes:
   forming a conductive polymer to a greater thickness than the depth of an impression pattern of the mold.

9. The method of claim 1, wherein imprinting a conductive polymer layer includes:
   heating the conductive polymer layer at a temperature higher than the melting point of the conductive polymer and lower than the glass transition temperature (Tg) of the base film; and
   impressing the conductive polymer layer by the mold to imprint the impression pattern on the conductive polymer layer.

10. The method of claim 9, wherein imprinting the conductive polymer layer includes cooling the mold continuously.

11. The method of claim 9, wherein imprinting the conductive polymer layer includes impressing the conductive polymer layer by the mold close to one surface of the base film.

12. The method of claim 11, wherein the wiring pattern includes a convex portion of the conductive polymer layer.

13. The method of claim 1, further comprising: removing the protection layer before forming the solder resist layer.

14. The method of claim 1, wherein forming the protection layer comprises spraying and curing at least one of silane and silicone polymer solution on the conductive polymer layer.

15. A method for manufacturing a tape wiring board, the method comprising:

forming a conductive polymer layer on a base film;
forming a protection layer on the conductive polymer layer;
imprinting the conductive polymer layer by a mold to form a wiring pattern; and
removing the protection layer;

after removing the protection layer, forming a solder resist layer on the conductive polymer layer to cover the wiring pattern.

* * * * *